United States Patent
Proie et al.

(10) Patent No.: US 10,027,107 B2
(45) Date of Patent: Jul. 17, 2018

(54) ELECTRONIC DEVICE WITH REVERSE VOLTAGE PROTECTION CIRCUITRY FOR MULTIPLE CONTROL LINES

(71) Applicant: Apple Inc., Cupertino, CA (US)

(72) Inventors: Robert M. Proie, San Mateo, CA (US); Salvatore Reddiconto, San Jose, CA (US)

(73) Assignee: Apple Inc., Cupertino, CA (US)

( * ) Notice: Subject to any disclaimer, the term of this patent is extended or adjusted under 35 U.S.C. 154(b) by 340 days.

(21) Appl. No.: 15/091,100

(22) Filed: Apr. 5, 2016

(65) Prior Publication Data

US 2017/0288392 A1    Oct. 5, 2017

(51) Int. Cl.
| | |
|---|---|
| *H02H 3/18* | (2006.01) |
| *H02H 3/20* | (2006.01) |
| *H02H 9/02* | (2006.01) |
| *H01L 27/06* | (2006.01) |
| *H02H 3/00* | (2006.01) |

(52) U.S. Cl.
CPC ............ *H02H 3/20* (2013.01); *H01L 27/0635* (2013.01); *H02H 3/003* (2013.01); *H02H 3/18* (2013.01); *H02H 9/02* (2013.01)

(58) Field of Classification Search
CPC ............ H02H 3/003; H02H 3/18; H02H 3/20; H02H 9/02; H01L 27/0635
See application file for complete search history.

(56) References Cited

U.S. PATENT DOCUMENTS

| | | | |
|---|---|---|---|
| 2006/0001099 A1 | 1/2006 | Motz | |
| 2006/0250737 A1* | 11/2006 | Sasitornwannakul | H02H 7/1213 361/82 |
| 2008/0225454 A1 | 9/2008 | Wotruba et al. | |
| 2009/0278571 A1 | 11/2009 | Pietri et al. | |
| 2011/0188164 A1* | 8/2011 | Desrochers | H02H 3/18 361/92 |
| 2011/0291749 A1 | 12/2011 | Lawas | |
| 2013/0188287 A1* | 7/2013 | Imura | H02H 3/18 361/56 |
| 2014/0160600 A1* | 6/2014 | Maggio | H02H 3/18 361/18 |

FOREIGN PATENT DOCUMENTS

WO    2013188155    12/2013

* cited by examiner

*Primary Examiner* — Scott Bauer
(74) *Attorney, Agent, or Firm* — Treyz Law Group, P.C.; Jason Tsai (57) ABSTRACT

A host electronic device may be coupled to an accessory electronic device. The host device and the accessory device may be connected via power supply lines and user data lines. If the host and accessory devices are improperly connected or if the accessory device is exposed to an incorrect voltage environment, the internal circuitry on the accessory device can be damaged. The accessory device may therefore include a reverse voltage protection circuit that can help prevent a large amount of current from inadvertently flowing into the accessory device. The protection circuit may include a low-side-enabled reverse current protection switch coupled between the external and internal ground terminals and also a single low-drop switch coupled to each of the user data lines. The low-drop switch will be activated whenever the voltage at the external ground terminal exceeds the voltage at the data line to help deactivate low-side-enabled reverse current protection switch.

20 Claims, 7 Drawing Sheets

ELECTRONIC DEVICE WITH REVERSE VOLTAGE PROTECTION CIRCUITRY FOR MULTIPLE CONTROL LINES

BACKGROUND

This relates generally to electronic devices and, more particularly, to power protection circuitry for electronic devices.

Electronic devices such as cellular telephones, media players, tablet computers, and other devices are often coupled to accessories. For example, an accessory device may have a keyboard, display, speakers, or other components that can be connected to a host electronic device for use in receiving inputs from or outputting content to a user.

During normal operation, the host device may supply power to the accessory. If the accessory is improperly connected to the host device, such as when the power supply ports are inadvertently inverted, a high voltage can be delivered to ground power supply port of the accessory while a low voltage can be delivered to a positive power supply port of the accessory. In such scenarios, it may be desirable to decouple the incorrectly connected power supply path between the host device and the accessory to prevent damaging the internal circuitry within the accessory. This problem becomes even more challenging to solve when there are other data ports in additional to the power and ground power supply ports coupled between the host device and the accessory.

It would therefore be desirable to be able to provide improved voltage protection circuitry for preventing damage from reverse voltage when accessories are coupled to the electronic device.

SUMMARY

A host electronic device (e.g., a host computer) may be coupled to an accessory electronic device (e.g., a keyboard, joystick, scrolling wheels, touch pads, key pads, microphones, speakers, earphones, displays, cameras, sensors, or other input-output devices). The host device may communicate with the accessory device via a ground power supply line and at least two non-ground signal lines (e.g., a positive power supply line and one or more data lines).

In accordance with an embodiment, the accessory device may be provided with a reverse voltage protection circuit configured to prevent internal circuitry within the accessory device from being damaged when the external ports of the accessory device are improperly connected. In particular, the reverse voltage protection circuit may have an external positive power supply (Vcc) port, an external ground power supply (Vss) port, at least one external data port, and an internal ground terminal. The reverse voltage protection circuit may include a first switch (e.g., a low-side-enabled reverse current protection switch) that is coupled between the external Vss port and the internal ground terminal and a second switch (e.g., a small low-drop switch) that is coupled between the first switch and the external data port.

In particular, the first switch may be an NMOS device having a source terminal connected to the external Vss port, a drain terminal connected to the internal ground terminal, and a gate terminal that is coupled to the external Vcc port via an optional current limiting resistor. The second switch may be a bipolar junction transistor (BJT) having an emitter terminal that is connected to the external data port, a collector terminal that is connected to the gate terminal of the first switch, and a base terminal that is coupled to the external Vss port.

Configured in this way, the first switch may be automatically shut off whenever the voltage at the external Vss port is greater than the voltage at the external Vcc port. The second switch may be automatically turned on whenever the voltage at the external Vss port is greater than the voltage at the external data port. When the second switch is turned on, the voltage at the gate of the first switch will be pulled low. As a result, the first switch is deactivated to prevent a large amount of current from inadvertently flowing into the internal ground terminal.

To minimize cost and optimize performance, the second switch should be substantially smaller than the first switch. Also, the second switch should exhibit a threshold voltage that is lower than that of the first switch to maximize response times. A low-drop diode may be coupled between the external data port and the internal ground terminal to further enhance response time.

Further features of the invention, its nature and various advantages will be more apparent from the accompanying drawings and the following detailed description of the preferred embodiments.

DETAILED DESCRIPTION

Figure 1:
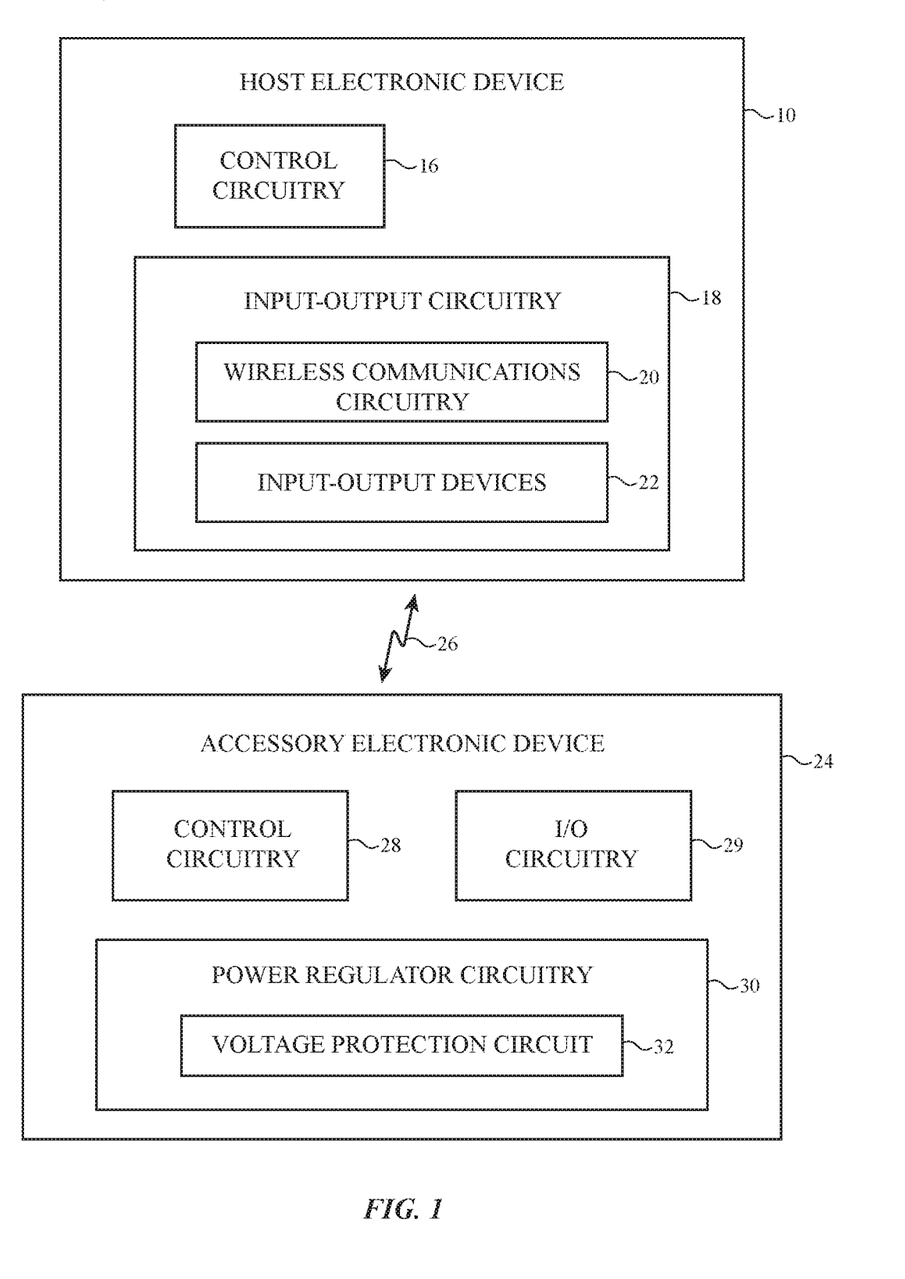
FIG. 1 is a diagram of a system in which a host electronic device is coupled to an accessory electronic device in accordance with an embodiment.

An illustrative system containing a host electronic device that can be coupled to an accessory electronic device with protection circuitry is shown in FIG. 1. As shown in FIG. 1, system 8 may include a host device such as electronic device 10 and an accessory device such as electronic device 24 or other external equipment. Path 26 may be used to couple devices 10 and 14. Path 26 may include power lines such as a positive power line through which a positive power supply current flows, a ground power line through which a ground power supply current flows, and/or other data signal lines. Path 26 may also include analog and/or digital signals lines (e.g., a pair of data lines, etc.).

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Device 10 may also have input-output circuitry 18. Input-output circuitry 18 may include wireless communications circuitry 20 (e.g., radio-frequency transceivers) for supporting communications with radio-frequency cell towers, satellite navigation systems, wireless access points, wireless wearable devices, or other wireless components.

Input-output circuitry 18 may also include input-output devices 22 that are used to allow data to be supplied to device 10 and to allow data to be provided from device 10 to external devices. Input-output devices 22 may include buttons, joysticks, scrolling wheels, touch pads, key pads, keyboards, microphones, speakers, displays (e.g., touch screen displays), tone generators, vibrators (e.g., piezoelectric vibrating components, etc.), cameras, sensors, light-emitting diodes and other status indicators, data ports, etc. A user can control the operation of device 10 by supplying commands through input-output devices 22 and may receive status information and other output from device 10 using the output resources of input-output devices 22. If desired, some or all of these input-output devices may be incorporated into accessory device 24. As an example, system 8 may have a keyboard or a touch pad component that is incorporated into only accessory device 24 to help save space on host device 10. These examples are merely illustrative and are not intended to limit the scope of the present invention.

Accessory electronic device 24 may include control circuitry 28 (e.g., control circuitry such as control circuitry 16 of device 10) and input-output circuitry 29. As with control circuitry 16 of device 10, control circuitry 28 of device 24 may include one or more integrated circuits such as memory circuits, processors, and application-specific integrated circuits that are used to run the software or firmware on device 24. Input-output circuitry 29 may include user interface components such as buttons, joysticks, scrolling wheels, touch pads, key pads, keyboards, speakers, microphones, displays, touch sensors, and other devices for gathering input or presenting output to a user. Input-output circuitry 29 may also include wired communications circuits, wireless communications circuitry, sensors, and other electronic device components.

Still referring to FIG. 1, accessory electronic device 24 may also be provided with power regulator circuitry such as power regulator circuitry 30. Power regulator circuitry 30 may, as an example, be used in converting alternating current (AC) power from an AC or battery power into a regulated source of direct current (DC) power for use by electrical components of device 14. In accordance with an embodiment, power regulator circuitry 30 may include a voltage protection component such as reverse voltage protection circuit 32. Reverse voltage protection circuit 32 may be used to decouple the power source provided from host device 10 whenever an improper connection is detected to help prevent components within accessory device 24 from being damaged.

Figure 2A:
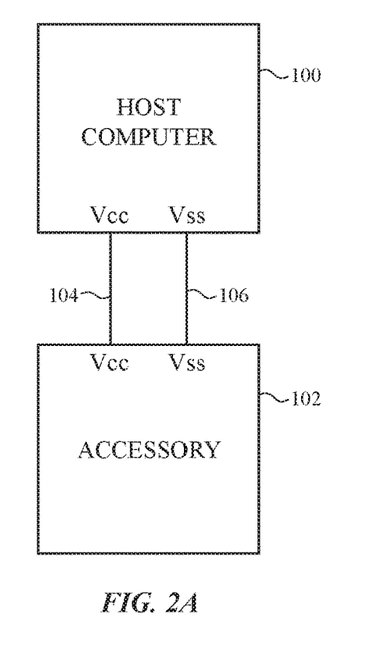
FIG. 2A is a diagram showing a host electronic device having power supply ports that are properly coupled to corresponding power supply ports of an accessory electronic device.

FIG. 2A is a diagram showing a host electronic device such as host computer 100 having power supply ports that are properly coupled to corresponding power supply ports of an accessory electronic device such as accessory 102. As shown in FIG. 2A, host computer 100 has a positive power supply (Vcc) port and a ground power supply (Vss) port. Similarly, accessory 102 has a positive power supply (Vcc) port and a ground power supply (Vss) port. When host computer 100 and accessory 102 are properly connected together, the Vcc ports of both devices are connected (as indicated by connection path 104) while the Vss ports of both devices are connected (as indicated by connection path 106). When the power supply ports of devices 100 and 102 are properly connected, the devices are allowed to operate as intended.

Figure 2B:
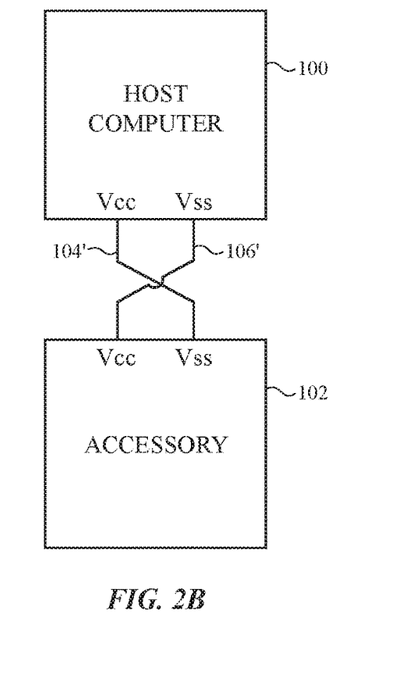
FIG. 2B is a diagram showing a host electronic device having power supply ports that are improperly coupled to corresponding power supply ports of an accessory electronic device.

FIG. 2B is a diagram showing a scenario in which host computer 100 and accessory 102 are improperly connected, typically due to mishandling by a user of the system. As shown in FIG. 2B, the Vcc port of host computer 100 may be inadvertently connected to the Vss port of accessory 102 (as indicated by connection path 104') while the Vss port of host computer 100 may be inadvertently connected to the Vcc port of accessory 102 (as indicated by connection path 106'). When the power supply ports are swapped or inverted in this way, a reverse voltage will be presented to accessory 102 (i.e., the Vss terminal will be receiving a higher voltage than the Vcc terminal), and it may be desirable to cut off the incoming power source received at accessory 102 to prevent the reverse voltage from causing any permanent damage to the internal components on accessory 102.

Figure 3:
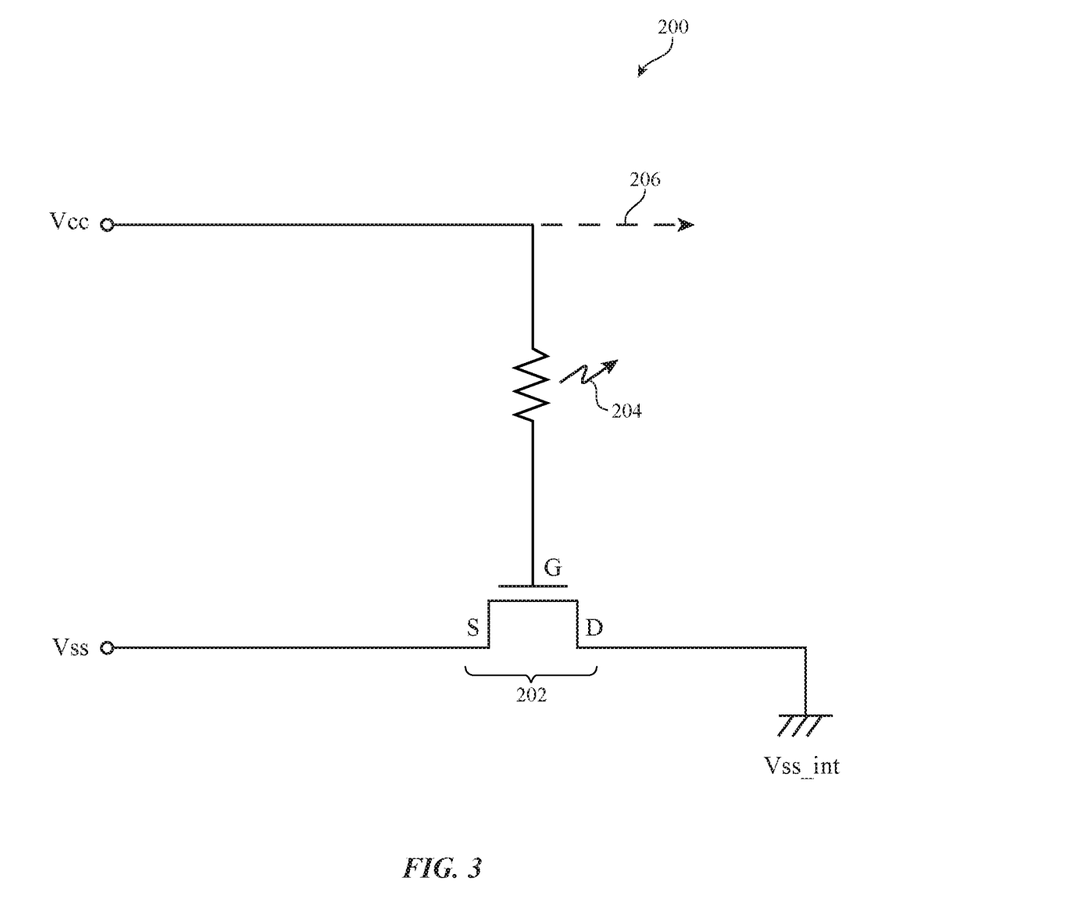
FIG. 3 is a circuit diagram of a low-side-enabled reverse voltage protection circuit that can be included within an accessory electronic device.

FIG. 3 is a circuit diagram showing one suitable implementation of a low-side-enabled reverse voltage protection circuit that can be included within accessory electronic device 102 to help cut off the power source whenever a reverse voltage scenario is detected. As shown in FIG. 3, low-side-enabled reverse voltage protection circuit may include a low-side reverse current protection switch such as low-side reverse current protection transistor 202 that is coupled between the external ground (Vss) port and an internal ground (Vss_int) port. The Vss port and the Vcc ports are used to connect directly with a corresponding host device and are sometimes referred to as external power supply ports. The external power supply ports can be selectively coupled to the internal power supply terminals within accessory 102.

In the example of FIG. 3, reverse voltage protection circuit 200 is only provided with low-side reverse current transistor 202 for decoupling the external Vss port from the internal Vss_int terminal. The external Vcc port may be coupled directly to internal circuitry on accessory 102 via path 206. In particular, transistor 202 may have a source (S) terminal that is connected to the external Vss port, a drain (D) terminal that is connected to the internal Vss_int terminal, and a gate (G) terminal that is connected to the external Vcc port via resistor 204. Resistor 204 may serve as an optional current limiting transistor that need not be used.

Configured in this way, transistor 202 is normally turned on when the Vcc port is receiving a positive voltage and when the Vss port is receiving a ground voltage (e.g., when voltage Vss is zero volts). A high voltage presented at the gate terminal of transistor 202 and a low voltage presented at the source terminal of transistor 202 places transistor 202 in a strong on state so that ground voltage Vss can be passed through to the internal ground voltage terminal through transistor 202.

If, however, the high and low voltage at the Vcc and Vss external ports are inverted (i.e., when the Vcc port is now receiving a ground voltage while the Vss port is now receiving a high voltage), a low voltage will be presented to the gate terminal of transistor 202, thereby selectively turning off transistor 202. When transistor 202 is deactivated, the internal Vss_int ground terminal will be isolated from the external Vss ground port to help prevent a large amount of current from inadvertently flowing into accessory device 102.

Figure 4A:
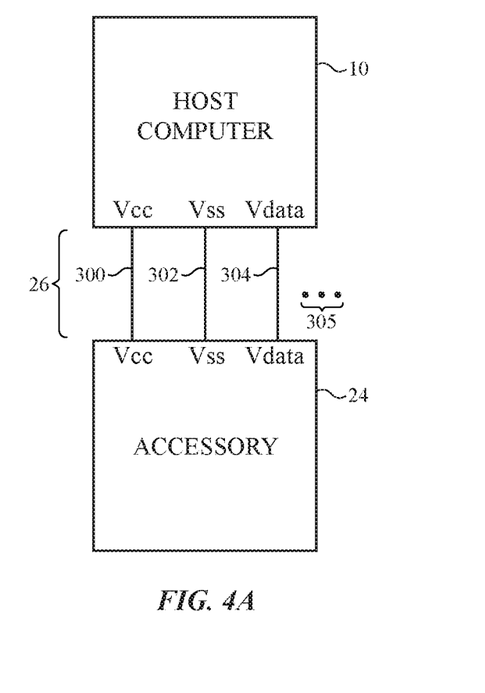
FIG. 4A is a diagram showing an interface between a host electronic device and an accessory electronic device that includes at least two non-ground signal paths in accordance with an embodiment.

The example of FIGS. 2 and 3 involve only two power supply lines and are relatively simplistic. In more complex arrangements, the host computer and the accessory device may be connected using more than two power supply lines. FIG. 4A is a diagram showing host computer 10 (e.g., host electronic device 10 as shown in FIG. 1) having power supply ports and additional data port(s) that are properly coupled to corresponding power supply and data ports of an accessory device 24 (e.g., accessory electronic device 24 as shown in FIG. 1). As shown in FIG. 4A, host device 10 may have a ground power supply (Vss) port, a first non-ground signal port such as a positive power supply (Vcc) port, and a second non-ground signal port such as a data (Vdata) port. Similarly, accessory device 24 may have a corresponding Vss port, a Vcc port, and a Vdata port.

When host computer 10 and accessory 24 are properly connected together, the Vcc ports of both devices are connected (as indicated by connection 300), the Vss ports of both devices are connected (as indicated by connection 302), and the Vdata ports of both devices are connected (as indicated by connection 304). When all external ports of devices 10 and 24 are properly connected, the devices are allowed to operate as intended. Connection lines 300, 302, and 304 collectively represent interface 26 through which devices 10 and 24 can communicate.

The example of FIG. 4A in which interface 26 includes only three connection lines is merely illustrative and does not limit the scope of the present invention. If desired, interface 26 may include a ground signal line along with more than two non-ground signal lines, a positive power supply signal line along with two or more ground signal lines, two or more additional user data lines 304, two or more additional control lines, etc. (as shown by dots 305).

Figure 4B:
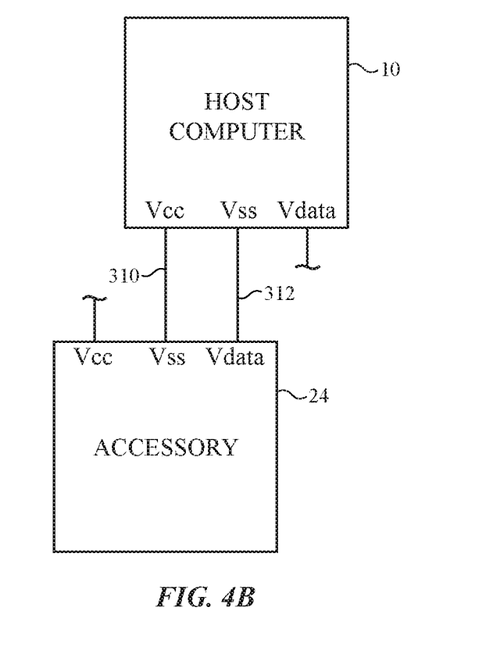
FIG. 4B is a diagram showing how the interface of FIG. 4A can be improperly connected so that a high voltage is presented on the ground port of the accessory electronic device in accordance with an embodiment.

FIG. 4B is a diagram showing how the interface of FIG. 4A can be improperly connected so that a high voltage is presented on the ground port of the accessory electronic device. Such a scenario might, for example, arise when the interface connection is accidentally shifted laterally to the right or left due to mishandling by a user (as viewed from the orientation of FIG. 4B). In the exemplary scenario of FIG. 4B, the Vcc port of host device 10 might be accidentally connected to the Vss port of accessory device 24 (as indicated by connection 310), and the Vss port of host device 10 might be accidentally connected to the Vdata port of accessory device 24 (as indicated by connection 312). The Vdata port of host device 10 and the Vcc port of accessory device 24 might not be electrically connected to anything in this particular scenario.

When connected in this way, the Vss port of accessory 24 will see a high voltage from the Vcc port of host computer 10, whereas the Vdata port of accessory 24 will see a low voltage from the Vss port of host computer 10. In such scenarios, it would be desirable to deactivate the Vss port of accessory 24 to help prevent a large amount of current from flowing from the Vcc port of host device 10 to the Vss port of accessory 24 (e.g., to help decoupled the external Vss port of accessory 24 from its internal ground terminal). Note that reverse voltage protection circuit 200 as shown in FIG. 3 will not be sufficient in this scenario since the external Vcc port—which will be floating in the example of FIG. 4B—is still high, so transistor 202 will still be turned on and current will still be able to flow from the external Vss port to the internal Vss_int terminal.

Figure 5:
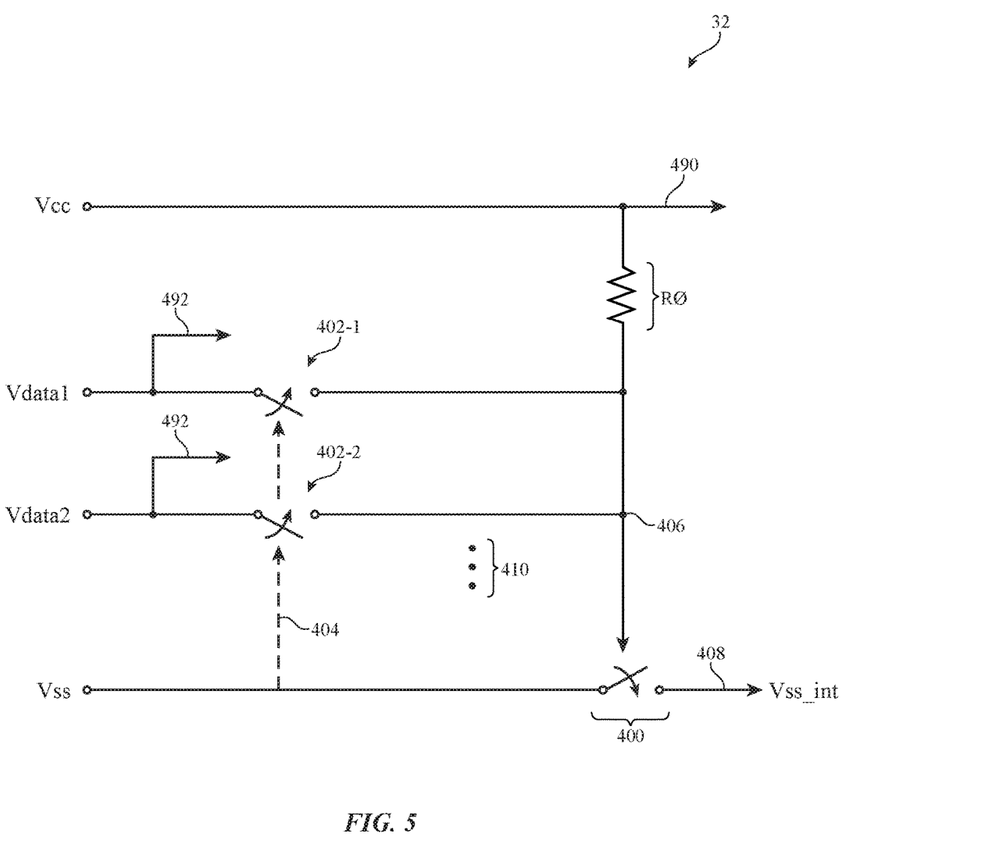
FIG. 5 is a diagram of an illustrative reverse voltage protection circuit that includes a main low-side reverse current protection switch and an auxiliary low-drop switch for each additional non-ground signal path in accordance with an embodiment.

In accordance with an embodiment, accessory electronic device 24 may be provided with reverse voltage protection circuit 32 that is capable of detecting improper connections and providing reverse voltage protection for host-accessory interfaces having at least two non-grounding signals, which may include positive power supply voltage signals, user data signals, and other control signals (see, e.g., FIG. 5). As shown in FIG. 5, reverse voltage protection circuit 32 may include an external positive power supply (Vcc) port, an external ground power supply (Vss) port, at least a first data (Vdata1) port, at least a second data (Vdata2) port, and an internal ground power supply (Vss_int) terminal. In the example of FIG. 5, there are three non-ground signals (e.g., Vcc, Vdata1, and Vdata2). In general, the accessory device may receive more than two non-ground signals, more than three non-ground signals, five or more non-ground signals, or other suitable numbers of non-ground signals (as indicated by dots 410).

The Vcc, Vss, Vdata1, and Vdata2 represent input-output ports that interface directly with the host electronic device and may therefore be generically referred to as "external" ports. The Vss_int terminal, on the other hand, is directly coupled to one or more ground planes or ground islands within the accessory electronic device to help power the internal circuitry and may therefore sometimes be referred to as an "internal" power supply terminal. The external Vcc port may be coupled directly to internal circuitry on accessory 24 via path 490. The external Vdata port2 (e.g., Vdata1 and Vdata2 ports) may be coupled directly to internal circuitry on accessory 24 via paths 492.

The Vss_int terminal may be selectively coupled to the external Vss pin via a switch such as switch 400. Having a current protection switch at the ground terminal helps detect high voltages being inadvertently applied to the Vss port. This type of monitoring scheme in which automatic current surge protection is provided at the ground power supply line is sometimes referred to as low-side-enabled protection. Switch 400 can therefore be referred to as a low-side-enabled current protection switch.

In particular, low-side enabled current protection switch may have a first terminal that is connected to the Vss port, a second terminal that is connected to the Vss_int terminal (via path 408), and a control terminal (node 406) that is coupled to the Vcc port via an optional current limiting resistor such as resistor R0. Connected in this way, switch 400 is activated whenever voltage at the Vcc port is greater than the voltage at the Vss port. If, however, the voltage at the Vcc port is less than the voltage at the Vss port (such as when the external ports are improperly connected), switch 400 may be automatically deactivated to decouple the internal Vss_int terminal from the external Vss port.

In accordance with an embodiment, reverse voltage protection circuit 32 may also be provided with a low-drop switch on each of the additional non-ground signal lines to help protect those lines from receiving undesired power surges. Still referring to FIG. 5, a first low-drop switch such as switch 402-1 may be coupled between the Vdata1 port and node 406, whereas a second low-drop switch such as switch 402-2 may be coupled between the Vdata2 port and node 406. Low-drop switches 402-1 and 402-2 may have control terminals that are tied to the Vss port via path 404. In arrangements that include more than two data or control lines, each of the additional data/control lines may be provided with its own dedicated low-drop switch 402.

Connected in this way, switch 402-1 may be activated whenever the voltage at the Vss port exceeds the voltage at the Vdata1 port and may be deactivated whenever the voltage at the Vss port is less than the voltage at the Vdata1 port. Similarly, switch 402-2 may be turned on whenever the voltage at the Vss port exceeds the voltage at the Vdata2 port and may be turned off whenever the voltage at the Vss port is less than the voltage at the Vdata2 port. Normally, when the external ports are properly connected, switches 402 will be turned off. Switches 402 will, however, be switched into use when the external ports are improperly connected such that the voltage level at Vss exceeds that at either the Vdata1 or the Vdata2 port. When at least one of switches 402 is turned on, the activated switch(es) will pull node 406 low, thereby deactivating low-side-enabled current protection switch 400 to help prevent damage to the internal circuitry within the accessory device. Switch 400 is sometimes referred to as the "main" low-side-enabled reverse current protection switch while switches 402 (e.g., low-drop switches 402-1 and 402-2, etc.) are sometimes referred to as "auxiliary" switches.

Figure 6:
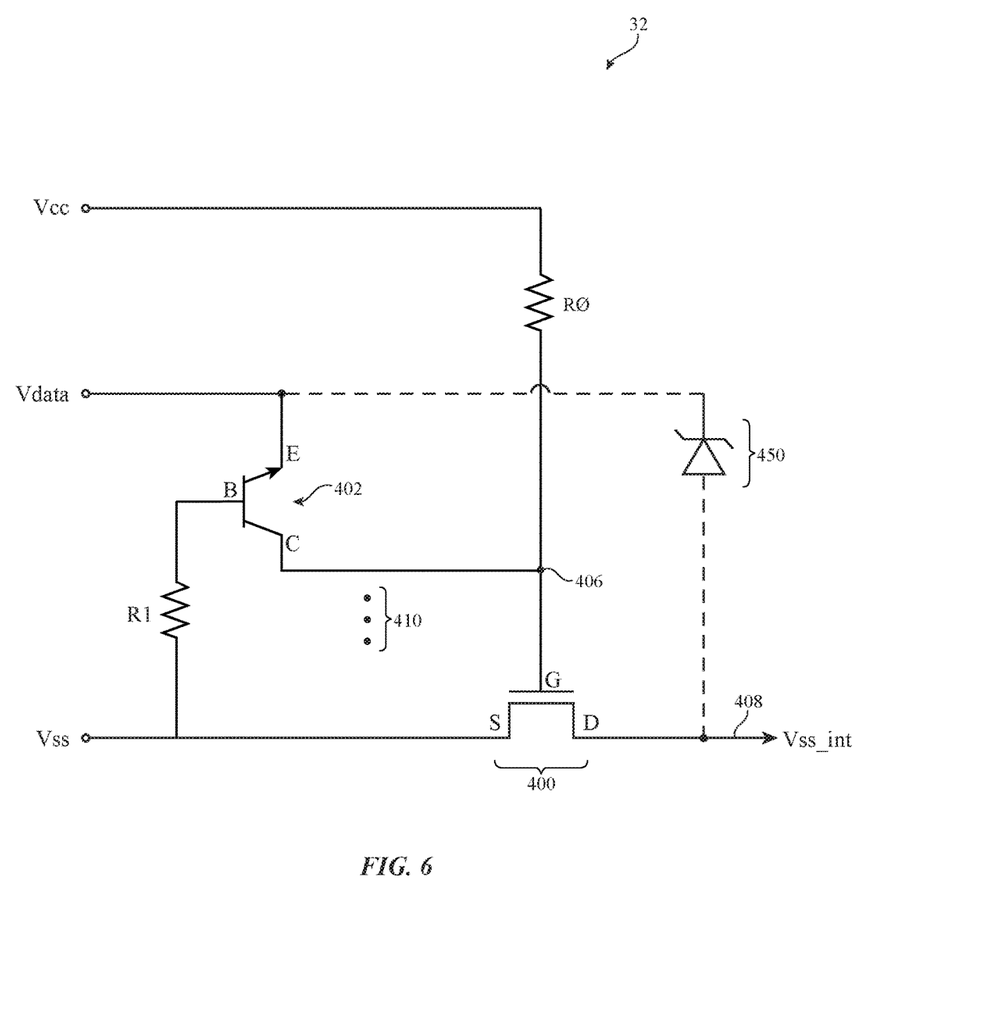
FIG. 6 is a circuit diagram showing one suitable implementation of the reverse voltage protection circuit shown in FIG. 5 in accordance with an embodiment.

FIG. 6 is a circuit diagram showing one suitable implementation of reverse voltage protection circuit 32 shown in FIG. 5. As shown in FIG. 6, low-side-enabled reverse current protection switch 400 may be implemented using a metal-oxide-semiconductor field-effect transistor (MOSFET) such as an n-channel MOS (NMOS) transistor. In particular, n-channel transistor 400 may have a source (S) terminal that is connected to the external Vss port, a drain (D) terminal that is connected to the internal Vss_int port, and a gate (G) terminal that is connected to node 406. Node 406 may be coupled to the external Vcc port via optional current limiting resistor R0.

Low-drop switch 402, on the other hand, may be implemented using a bipolar junction transistor (BJT) such as an NPN BJT device. Bipolar junction transistor 402 and NMOS transistor 400 are formed using different semiconductor fabrication technologies (e.g., switches 400 and 402 are different types of switches). The use of BJTs for switch 402 might be advantageous over other types of switches because bipolar transistors typically exhibit substantially smaller threshold voltages than other types of switches (e.g., the threshold voltage of BJTs may be less than that of CMOS transistors). Having a small turn-on threshold enables these "low-drop" switches to response faster to undesired voltages and changes at the external ports.

N-type BJT device 402 may have a collector (C) terminal that is connected to node 406, an emitter (E) terminal that is connected to the Vdata port, and a base (B) terminal that is connected to the Vss port via another optional current limiting resistor such as resistor R1. In general, switch 402 may be small compared to switch 400 to help minimize load capacitance and series resistance on the data/control lines. As an example, switch 402 may be at least two times smaller than switch 400, may be at least five times smaller than switch 400, at least ten times smaller than switch 400, etc. The additional of only a single switch per non-ground signal line is also very area and cost-efficient. The example of FIG. 6 in which low-drop switch 402 is implemented as a BJT device is merely illustrative and does not serve to limit the scope of the present invention. If desired, each additional low-drop switch 402 may be implemented using a MOS transistor, a microelectromechanical (MEMS) relay switch, or other types of semiconductor switches with low turn-on threshold levels and/or fast response times.

In accordance with some embodiments, an additional low-drop diode (e.g., a Zener diode) such as diode 450 may be coupled between the Vdata port and the internal Vss_int terminal. In particular, diode 450 may have a p-type terminal that is connected to the Vss_int terminal and an n-type terminal that is connected to the Vdata port. Connected in this way, diode 450 may help provide fast short-term protection for each data/control line. In general, a separate low-drop diode may be provided for each additional non-ground signal line.

Figure 7:
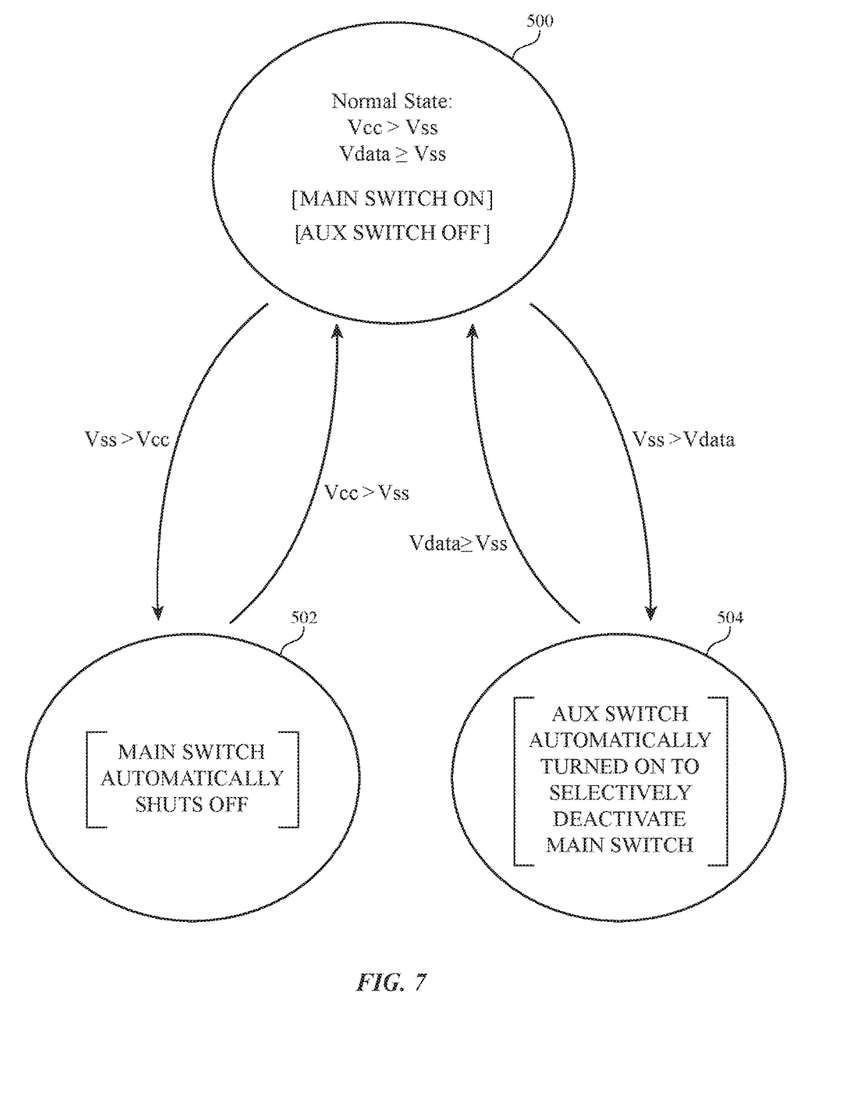
FIG. 7 is a state diagram showing different modes in which a reverse voltage protection circuit of the type shown in FIG. 5 may be operated in accordance with an embodiment.

FIG. 7 is a state diagram showing different modes in which a reverse voltage protection circuit of the type shown in FIG. 5 may be operated in accordance with an embodiment. When the voltage at the external Vcc port is greater than the voltage at the external Vss port and when the voltage at the Vdata port is greater than or equal to the voltage at the external Vss port, the reverse voltage protection circuit may be placed in a normal/default state 500. The Vdata part is frequently biased to the ground voltage but can sometimes be greater than zero volts during normal operation. In normal state 500, main switch 400 may be turned on, whereas each auxiliary switch 402 may be turned off.

In response to the voltage at the Vss port exceeding the voltage at the Vcc port, the reverse voltage protection circuit may be placed in state 502, where main switch 400 automatically shuts off to cut off the current path between the external Vss port and the internal Vss_int terminal. This can happen whenever the voltages at the Vcc and Vss ports are inverted. The reverse voltage protection circuit may revert back to back 500 when the power supply voltages return to their desired levels (i.e., when the voltage at Vcc is greater than the voltage at Vss).

In response to the voltage at the Vss port exceeding the voltage at any of the Vdata ports, the reverse voltage protection circuit may be placed in state 504, where the corresponding auxiliary switch 402 is automatically turned on to selectively deactivate main switch 400. This can happen whenever the voltages at the Vdata and Vss ports are inverted. The reverse voltage protection circuit may revert back to back 500 when the power supply voltages return to their desired levels (i.e., when the voltage at Vdata is greater than or equal to the voltage at Vss).

The examples described above related to low-side protection of the internal ground terminal is merely illustrative. If desired, these techniques may also be extended to provide high-side-enabled protection (e.g., to help decouple an internal positive power supply terminal from the external Vcc port). In another suitable arrangement, the accessory device may be provided with only high-side-enabled reverse voltage protection. In yet another suitable arrangement, the accessory device may be provided with both low-side-enabled and high-side-enabled reverse voltage protection. In general, these techniques need not only be provided on the accessory device but may also optionally be implemented on the host electronic device.

The foregoing is merely illustrative and various modifications can be made by those skilled in the art without departing from the scope and spirit of the described embodiments. The foregoing embodiments may be implemented individually or in any combination.

What is claimed is:

1. A reverse voltage protection circuit, comprising:
a first external power supply port;
a second external power supply port;
an external data port;
an internal power supply terminal;
a first switch that is coupled between the second external power supply port and the internal power supply terminal; and
a second switch that is coupled between the external data port and the first switch.

2. The reverse voltage protection circuit of claim 1, wherein the first switch comprises a metal-oxide-semiconductor field-effect transistor (MOSFET), and wherein the second switch comprises a different type of switch than the first switch.

3. The reverse voltage protection circuit of claim 2, wherein the first switch comprises an n-channel transistor having a source terminal that is connected to the second external power supply port, a drain terminal that is connected to the internal power supply terminal, and a gate terminal that is coupled to the first external power supply port.

4. The reverse voltage protection circuit of claim 3, further comprising:
a current limiting resistor coupled between the gate terminal of the n-channel transistor and the first external power supply port.

5. The reverse voltage protection circuit of claim 1, wherein the first external power supply port comprises a positive power supply port, wherein the second external power supply port comprises a ground power supply port, and wherein the internal power supply terminal comprises a ground power supply terminal.

6. The reverse voltage protection circuit of claim 5, wherein the second switch is smaller than the first switch to help minimize capacitive loading on the external data port.

7. The reverse voltage protection circuit of claim 6, wherein the second switch comprises a bipolar junction transistor (BJT).

8. The reverse voltage protection circuit of claim 7, wherein the second switch comprises an NPN bipolar junction transistor having an emitter terminal that is connected to the external data port, a collector terminal that is coupled to the first external power supply port, and a base terminal that is coupled to the second external power supply port.

9. The reverse voltage protection circuit of claim 8, further comprising:
a current limiting resistor coupled between the base terminal of the NPN bipolar junction transistor and the second external power supply port.

10. The reverse voltage protection circuit of claim 8, further comprising:
a low-drop diode coupled between the emitter terminal of the NPN bipolar junction transistor and the internal power supply terminal.

11. A reverse voltage protection circuit, comprising:
a first external power supply port on which a first voltage is provided;
a second external power supply port on which a second voltage is provided;
an external data port on which a third voltage is provided;
a main switch that turns off when the second voltage exceeds the first voltage; and
an auxiliary switch that turns on when the second voltage exceeds the third voltage to deactivate the main switch.

12. The reverse voltage protection circuit of claim 11, wherein the main switch and the auxiliary switches are fabricated using different types of semiconductor processes.

13. The reverse voltage protection circuit of claim 12, wherein the main switch comprises a metal-oxide-semiconductor field-effect transistor, and wherein the auxiliary switch comprises a bipolar junction transistor.

14. The reverse voltage protection circuit of claim 11, wherein the auxiliary switch is at least two times smaller than the main switch.

15. The reverse voltage protection circuit of claim 11, wherein the main switch has a first threshold voltage level, and wherein the auxiliary switch has a second threshold voltage level that is less than the first threshold voltage level.

16. An accessory electronic device that is coupled to a host electronic device and that comprises:
an external ground port;
a first external non-ground port;
a second external non-ground port;
an internal ground terminal;
a first switch that is coupled between the external ground port and the internal ground terminal; and
a second switch that is coupled between the first switch and the second external non-ground port.

17. The accessory electronic device of claim 16, wherein the first external non-ground port comprises a positive power supply port, and wherein the second external non-ground port comprises a user data signal port.

18. The accessory electronic device of claim 16, wherein the first switch comprises an n-channel transistor having a gate terminal that is coupled to the first external non-ground port.

19. The accessory electronic device of claim 18, wherein the second switch comprises a low-drop switch having a first terminal connected to the gate terminal of the n-channel transistor, a second terminal that is connected to the second external non-ground port, and a third terminal that is coupled to the external ground port.

20. The accessory electronic device of claim 19, further comprising:
a third external non-ground port; and
a third switch having a first terminal connected to the gate terminal of the n-channel transistor, a second terminal that is connected to the third external non-ground port, and a third terminal that is coupled to the external ground port.

* * * * *